United States Patent
Harada et al.

(10) Patent No.: US 9,184,230 B2
(45) Date of Patent: Nov. 10, 2015

(54) SILICON CARBIDE VERTICAL FIELD EFFECT TRANSISTOR

(75) Inventors: Yuichi Harada, Tsukuba (JP); Shinsuke Harada, Tsukuba (JP); Yasuyuki Hoshi, Tsukuba (JP); Noriyuki Iwamuro, Tsukuba (JP)

(73) Assignees: FUJI ELECTRIC CO., LTD., Kawasaki-shi (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/006,548

(22) PCT Filed: Apr. 6, 2012

(86) PCT No.: PCT/JP2012/059489
§ 371 (c)(1),
(2), (4) Date: Sep. 20, 2013

(87) PCT Pub. No.: WO2012/137914
PCT Pub. Date: Oct. 11, 2012

(65) Prior Publication Data
US 2014/0008666 A1    Jan. 9, 2014

(30) Foreign Application Priority Data

Apr. 8, 2011    (JP) ................... 2011-086008

(51) Int. Cl.
*H01L 29/15*    (2006.01)
*H01L 29/06*    (2006.01)
(Continued)

(52) U.S. Cl.
CPC ........ *H01L 29/0615* (2013.01); *H01L 29/0626* (2013.01); *H01L 29/1095* (2013.01);
(Continued)

(58) Field of Classification Search
CPC ............ H01L 21/8213; H01L 29/7827; H01L 29/7802; H01L 29/7828; H01L 29/0847; H01L 29/66068; H01L 29/1608
USPC .................... 257/77, 329, 330, 350
See application file for complete search history.

(56) References Cited

U.S. PATENT DOCUMENTS

2004/0119076 A1*  6/2004  Ryu ............................. 257/77
2006/0057796 A1*  3/2006  Harada et al. ................ 438/199
(Continued)

FOREIGN PATENT DOCUMENTS

JP    05-259443 A    10/1993
JP    11-121748 A    4/1999
(Continued)

OTHER PUBLICATIONS

Notification of Transmittal of Translation of the International Preliminary Report on Patentability (Forms PCT/IB/326) of International Application No. mailed Oct. 17, 2013 with Forms PCT/IB/373, PCT/IB/338 and PCT/ISA/237, w/ English translation (12 pages).
(Continued)

*Primary Examiner* — Brook Kebede
(74) *Attorney, Agent, or Firm* — Westerman, Hattori, Daniels & Adrian, LLP

(57) ABSTRACT

A silicon carbide vertical field effect transistor includes a first-conductive-type silicon carbide substrate; a low-concentration first-conductive-type silicon carbide layer formed on a surface of the first-conductive-type silicon carbide substrate; second-conductive-type regions selectively formed on a surface of the first-conductive-type silicon carbide layer; first-conductive-type source regions formed in the second-conductive-type regions; a high-concentration second-conductive-type region formed between the first-conductive-type source regions in the second-conductive-type region; a source electrode electrically connected to the high-concentration second-conductive-type region and a first-conductive-type source region; a gate insulating film formed from the first-conductive-type source regions formed in adjacent second-conductive-type regions, onto the second-conductive-type regions and the first-conductive-type silicon carbide layer; a gate electrode formed on the gate insulating film; and a drain electrode on the back side of the first-conductive-type silicon carbide substrate, wherein an avalanche generating unit is disposed between the second-conductive-type region and the first-conductive-type silicon carbide layer.

7 Claims, 3 Drawing Sheets

(51) Int. Cl.
   *H01L 29/78* (2006.01)
   *H01L 29/10* (2006.01)
   *H01L 29/08* (2006.01)
   *H01L 29/16* (2006.01)

(52) U.S. Cl.
   CPC ........ *H01L29/7802* (2013.01); *H01L 29/7808* (2013.01); *H01L 29/7827* (2013.01); *H01L 29/0878* (2013.01); *H01L 29/1608* (2013.01)

(56) References Cited

U.S. PATENT DOCUMENTS

| | | | |
|---|---|---|---|
| 2006/0194400 A1* | 8/2006 | Cooper et al. | 438/309 |
| 2009/0008649 A1 | 1/2009 | Suzuki | |
| 2010/0012951 A1 | 1/2010 | Yatsuo et al. | |

FOREIGN PATENT DOCUMENTS

| | | |
|---|---|---|
| JP | 2001-094097 A | 4/2001 |
| JP | 2001-094098 A | 4/2001 |
| JP | 2004-006940 A | 1/2004 |
| JP | 2004-288890 A | 10/2004 |
| JP | 2008-098536 A | 4/2008 |
| JP | 2009-016601 A | 1/2009 |

OTHER PUBLICATIONS

International Search Report dated Jun. 26, 2012, issued in corresponding application No. PCT/JP2012/059489.

Written Opinion dated Jun. 26, 2012, issued in corresponding application No. PCT/JP2012/059489.

Notification of Transmittal of Translation of the International Preliminary Report on Patentability (Forms PCT/IB/326) of International Application No. PCT/JP2012/059489 mailed Oct. 17, 2013 with Forms PCT/IB/373, PCT/IB/338 and PCT/ISA/237, w/ English translation (12 pages).

Notice of Reasons for Rejection dated Apr. 14, 2015, issued in corresponding Japanese Patent Application No. 2013-508946 with English partial translation (6 pages).

* cited by examiner

SILICON CARBIDE VERTICAL FIELD EFFECT TRANSISTOR

TECHNICAL FIELD

The present invention relates to a silicon carbide vertical field effect transistor.

BACKGROUND ART

A silicon carbide vertical field effect transistor (see, e.g., Paten Document 1) such as a vertical MOS field effect transistor (MOSFET) is conventionally used with a semiconductor device as a switching device formed on a silicon carbide substrate. Although a silicon carbide vertical MOSFET is exemplarily illustrated and described as a silicon carbide vertical field effect transistor in this description, this is, of course, not a limitation of the present invention.

FIG 6 depicts a cross-sectional view of an N-channel MOSFET, which is a conventional silicon carbide (hereinafter abbreviated as "SiC") field effect transistor.

An N-type SiC layer 2 is formed on a surface of an N-type SiC substrate 1; multiple P-type regions 3 are formed on a surface of the N-type SiC layer 2; an N-type source region 4 and a P-type contact region 5 are formed on a surface of the P-type region 3; and a source electrode 8 is formed on surfaces of the N-type source region 4 and the P-type contact region 5. A gate electrode 7 is formed via a gate insulating film 6 on surfaces of the P-type regions 3 and the N-type SiC layer 2 between the N-type source regions 5. A drain electrode 9 is formed on a back side.

FIG 7 is a cross-sectional view of another N-channel MOSFET formed by using a P-type SiC layer on a surface. The N-type SiC layer 2 is formed on a surface of the N-type SiC substrate 1 and multiple P-type regions 10 are formed on a surface of the N-type SiC layer 2. A P-type SiC layer 11 is further formed on the surface. An N-type region 12 is formed in the P-type SiC layer 11 on the N-type SiC layer 2 where the P-type region 10 is not formed; the N-type source region 4 and the P-type contact region 5 are formed on a surface of the P-type silicon carbide region 11; and the source electrode 8 is formed on surfaces of the N-type source region 4 and the P-type contact region 5. The gate electrode 7 is formed via the gate insulating film 6 on surfaces of the P-type regions 3 and the N-type silicon carbide layer between the N-type source regions 5. The drain electrode 9 is formed on the back side.

In the MOSFETs of the structures depicted in FIGS. 6 and 7, and if voltage less than or equal to a gate threshold value is applied to the gate electrode 7 while positive voltage is applied to the drain electrode 9 relative to the source electrode 8, PN-junction between the P-type region 3 and the N-type SiC layer 2, or the P-type SiC layer 11 and the N-type region 12 is inversely-biased and therefore, no current flows.

On the other hand, if voltage greater than or equal to the gate threshold value is applied to the gate electrode 7, the formation of an inversion layer on the surface of the P-type region 3 or the P-type SiC layer 11 immediately below the gate electrode 7 causes current to flow and therefore, the switching operation of the MOSFET can be achieved by the voltage applied to the gate electrode 7.

However, if high voltage is applied to the drain electrode, particularly when the MOSFET is turned off, high voltage is applied to the drain electrode. In this case, if a large electric field is applied to the gate insulating film, insulation breakdown of the gate insulating film may occur or the reliability of the gate insulating film may significantly be reduced.

Patent Document 1: Japanese Laid-Open Patent Publication No. H11-121748

DISCLOSURE OF INVENTION

Problem to be Solved by the Invention

A problem to be solved by the present invention is to realize a silicon carbide vertical field effect transistor that can improve breakdown resistance of a gate insulating film since a large electric field is not applied to the gate insulating film when high voltage is applied to a drain electrode.

Means for Solving Problem

The problem is solved by the following silicon carbide vertical field effect transistors.

(1) A silicon carbide vertical field effect transistor that includes a first-conductive-type silicon carbide substrate; a low-concentration first-conductive-type silicon carbide layer formed on a surface of the first-conductive-type silicon carbide substrate; second-conductive-type regions selectively formed on a surface of the first-conductive-type silicon carbide layer; first-conductive-type source regions formed in the second-conductive-type regions; a high-concentration second-conductive-type region formed between the first-conductive-type source regions in the second-conductive-type region; a source electrode electrically connected to the high-concentration second-conductive-type region and a first-conductive-type source region among the first-conductive-type source regions; a gate insulating film formed from the first-conductive-type source regions formed in the second-conductive-type regions that are adjacent, onto the second-conductive-type regions and the first-conductive-type silicon carbide layer; a gate electrode formed on the gate insulating film; and a drain electrode on a back side of the first-conductive-type silicon carbide substrate, where an avalanche generating unit is disposed between the first-conductive-type silicon carbide layer and each of the second-conductive-type regions.

(2) A silicon carbide vertical field effect transistor that includes a first-conductive-type silicon carbide substrate; a low-concentration first-conductive-type silicon carbide layer formed on a surface of the first-conductive-type silicon carbide substrate; second-conductive-type regions selectively formed on a surface of the first-conductive-type silicon carbide layer; first-conductive-type source regions formed in the second-conductive-type regions; a high-concentration second-conductive-type region formed between the first-conductive-type source regions in the second-conductive-type region; a source electrode electrically connected to the high-concentration second-conductive-type region and a first-conductive-type source region among the first-conductive-type source regions; a gate insulating film formed from the first-conductive-type source regions formed in the second-conductive-type regions that are adjacent, onto the second-conductive-type regions and the first-conductive-type silicon carbide layer; a gate electrode formed on the gate insulating film; and a drain electrode on a back side of the first-conductive-type silicon carbide substrate, where a high-concentration second-conductive-type region is formed under the second-conductive-type region.

(3) A silicon carbide vertical field effect transistor that includes a first-conductive-type silicon carbide substrate; a low-concentration first-conductive-type silicon carbide layer formed on a surface of the first-conductive-type silicon carbide substrate; second-conductive-type regions selectively formed on a surface of the first-conductive-type silicon carbide layer; first-conductive-type source regions formed in the second-conductive-type regions; a high-concentration second-conductive-type region formed between the first-conductive-type source regions in the second-conductive-type region; a source electrode electrically connected to the high-concentration second-conductive-type region and a first-conductive-type source region among the first-conductive-type source regions; a gate insulating film formed from the first-conductive-type source regions formed in the second-conductive-type regions that are adjacent, onto the second-conductive-type regions and the first-conductive-type silicon carbide layer; a gate electrode formed on the gate insulating film; and a drain electrode on a back side of the first-conductive-type silicon carbide substrate, where a portion of the second-conductive-type region is shallowly formed.

(4) A silicon carbide vertical field effect transistor that includes a first-conductive-type silicon carbide substrate; a low-concentration first-conductive-type silicon carbide layer formed on a surface of the first-conductive-type silicon carbide substrate; a second-conductive-type region selectively formed on a surface of the first-conductive-type silicon carbide layer; second-conductive-type silicon carbide layers formed on surfaces of the first-conductive-type silicon carbide layer and the second-conductive-type region; a first-conductive-type region selectively formed on the first-conductive-type silicon carbide layer in the second-conductive-type silicon carbide layers; first-conductive-type source regions formed in the second-conductive-type silicon carbide layers; a high-concentration second-conductive-type region formed between the first-conductive-type source regions in the second-conductive-type silicon carbide layers; a source electrode electrically connected to the high-concentration second-conductive-type region and a first-conductive-type source region among the first-conductive-type source regions; a gate insulating film formed from the first-conductive-type source regions formed in the second-conductive-type silicon carbide layers that are adjacent, onto the second-conductive-type silicon carbide layers and the first-conductive-type region; a gate electrode formed on the gate insulating film; and a drain electrode on a back side of the first-conductive-type silicon carbide substrate, where the high-concentration second-conductive-type region is formed under the second-conductive-type region formed in the first-conductive-type silicon carbide layer.

(5) A silicon carbide vertical field effect transistor that includes a first-conductive-type silicon carbide substrate; a low-concentration first-conductive-type silicon carbide layer formed on a surface of the first-conductive-type silicon carbide substrate; a second-conductive-type region selectively formed on a surface of the first-conductive-type silicon carbide layer; second-conductive-type silicon carbide layers formed on surfaces of the first-conductive-type silicon carbide layer and the second-conductive-type region; a first-conductive-type region selectively formed on the first-conductive-type silicon carbide layer in the second-conductive-type silicon carbide layers; first-conductive-type source regions formed in the second-conductive-type silicon carbide layers; a high-concentration second-conductive-type region formed between the first-conductive-type source regions in the second-conductive-type silicon carbide layers; a source electrode electrically connected to the high-concentration second-conductive-type region and a first-conductive-type source region among the first-conductive-type source regions; a gate insulating film formed from the first-conductive-type source regions formed in the second-conductive-type silicon carbide layers that are adjacent, onto the second-conductive-type silicon carbide layers and the first-conductive-type region; a gate electrode formed on the gate insulating film; and a drain electrode on a back side of the first-conductive-type silicon carbide substrate, where a portion of the second-conductive-type region formed in the first-conductive-type silicon carbide layer is shallowly formed.

(6) A silicon carbide vertical field effect transistor that includes a first-conductive-type silicon carbide substrate; a low-concentration first-conductive-type silicon carbide layer formed on a surface of the first-conductive-type silicon carbide substrate; a second-conductive-type region selectively formed on a surface of the first-conductive-type silicon carbide layer; second-conductive-type silicon carbide layers formed on surfaces of the first-conductive-type silicon carbide layer and the second-conductive-type region; a first-conductive-type region selectively formed on the first-conductive-type silicon carbide layer in the second-conductive-type silicon carbide layers; first-conductive-type source regions formed in the second-conductive-type silicon carbide layers; a high-concentration second-conductive-type region formed between the first-conductive-type source regions in the second-conductive-type silicon carbide layers; a source electrode electrically connected to the high-concentration second-conductive-type region and a first-conductive-type source region among the first-conductive-type source regions; a gate insulating film formed from the first-conductive-type source regions formed in the second-conductive-type silicon carbide layers that are adjacent, onto the second-conductive-type silicon carbide layers and the first-conductive-type region; a gate electrode formed on the gate insulating film; and a drain electrode on a back side of the first-conductive-type silicon carbide substrate, where the second-conductive-type region formed in the first-conductive-type silicon carbide layer is formed to extend under a first-conductive-type region among the first-conductive-type regions formed in the second-conductive-type silicon carbide layer.

EFFECT OF THE INVENTION

According to the present invention, by causing an avalanche to occur under the high-concentration P-type region or in a region formed as a thin layer when high voltage is applied to the drain electrode, a large electric field is no longer applied to the gate insulating film, thereby enabling improvement in the breakdown resistance of the gate insulating film at the time of occurrence of the avalanche and enabling improvement in the reliability of the gate insulating film.

BEST MODE(S) FOR CARRYING OUT THE INVENTION

A silicon carbide vertical field effect transistor according to the present invention will be described in detail by exemplarily illustrating first to fifth embodiments.

The present invention is not limited to the following first to fifth embodiments and various design changes can be made without departing from the spirit of the present invention.

First Embodiment

Figure 1:
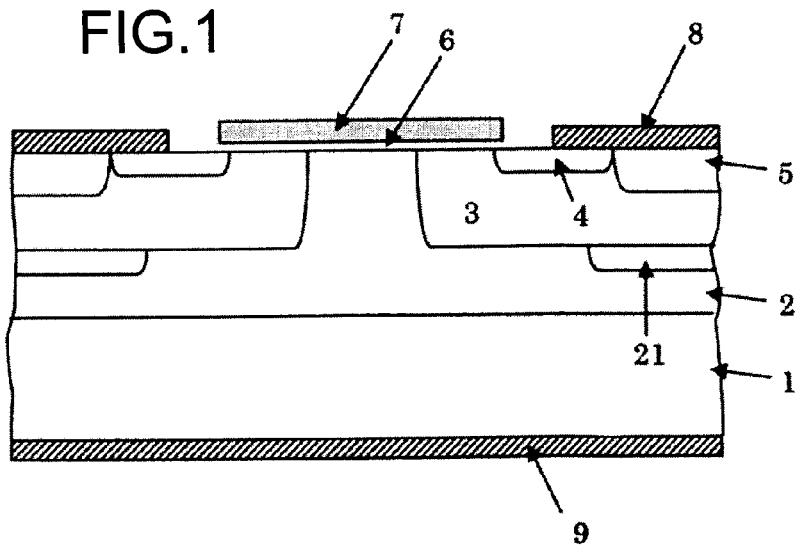
FIG 1 depicts a cross-sectional view of a MOSFET structure according to a first embodiment of the present invention.

FIG 1 depicts a cross-sectional view of a MOSFET structure according to the first embodiment of the present invention. Although a first conductive type is an N-type and a second conductive type is a P-type in the embodiments, the conductive types can be reversely formed.

In FIG 1, an N-type SiC layer 2 is formed on a surface of an N-type SiC substrate 1 and multiple P-type regions 3 are formed on a surface of the N-type SiC layer 2.

An N-type source region 4 and a P-type contact region 5 are formed on a surface of the P-type region 3. A source electrode 8 is formed on surfaces of the N-type source region 4 and the P-type contact region 5.

A high-concentration P-type region 21 is formed under the P-type region 3. A gate electrode 7 is formed, via a gate insulting film 6, on surfaces of the P-type regions 3 and the N-type SiC layer 2 interposed between the N-type source region 4 on the surface of the P-type region 3 and an N-type source region 4 on a surface of a P-type region 3 different from the P-type region 3, and a drain electrode 9 is formed on a back side.

A MOSFET having the structure of the first embodiment can be turned on by applying voltage greater than or equal to a threshold voltage, to the gate electrode to form an inversion layer on the surface of the P-type region as is the case with a conventional MOSFET.

The MOSFET formed in this way causes an avalanche to occur in a PN junction portion between the low-concentration N-type SiC layer 2 and the P-type region 21 with high voltage applied to the drain electrode and this prevents a large electric field from being applied to the gate oxide film, thereby enabling improvement in the insulation breakdown resistance of the gate insulating film when high voltage is applied to the drain electrode and enabling improvement in the reliability of the gate insulating film.

Second Embodiment

Figure 2:
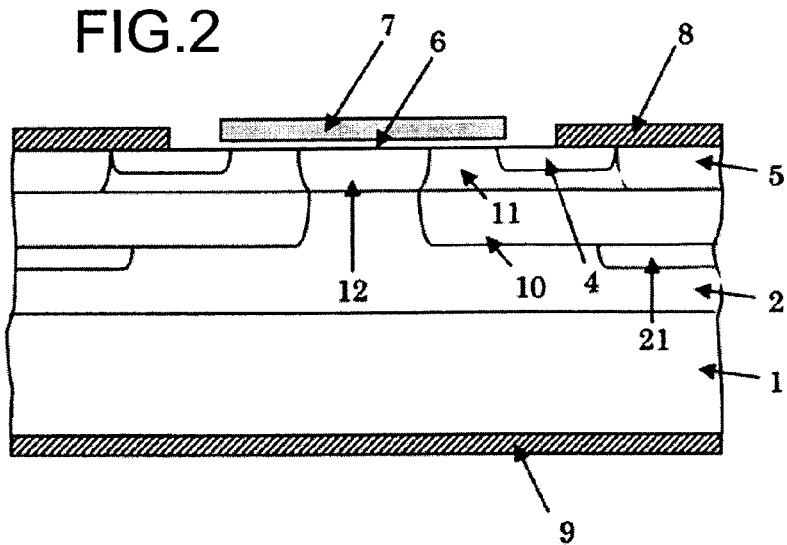
FIG 2 depicts a cross-sectional view of a MOSFET according to a second embodiment of the present invention.

FIG 2 depicts a cross-sectional view of a MOSFET according to a second embodiment of the present invention. The N-type SiC layer 2 is formed on a surface of the N-type SiC substrate 1 and multiple P-type regions 10 are formed on the surface of the N-type SiC layer 2. A P-type SiC layer 11 is further formed on the surface. An N-type region 12 is formed in the P-type SiC layer 11 to reach the N-type SiC layer 2.

The N-type source region 4 and the P-type contact region 5 are formed on a surface of the P-type SiC region 11. The source electrode 8 is formed on the surfaces of the N-type source region 4 and the P-type contact region 5.

A high-concentration P-type region 21 is formed under the P-type region 10. A gate electrode 7 is formed, via a gate insulting film 6, on surfaces of the P-type SiC layer 11 and N-type region 12 interposed between the N-type source region 4 on the surface of a P-type SiC layer 11 and an N-type source region 4 on a surface of another P-type SiC layer 11 different from the P-type SiC layer 11, and a drain electrode 9 is formed on a back side.

The MOSFET formed in this way also causes an avalanche to occur in the PN-junction portion between the low-concentration N-type SiC layer 2 and the P-type region 21 when high voltage is applied to the drain electrode without a large electric field being applied to the gate oxide film, resulting in the insulation breakdown resistance and the reliability of the gate insulating film exhibiting the same characteristics as the first embodiment.

Third Embodiment

Figure 3:
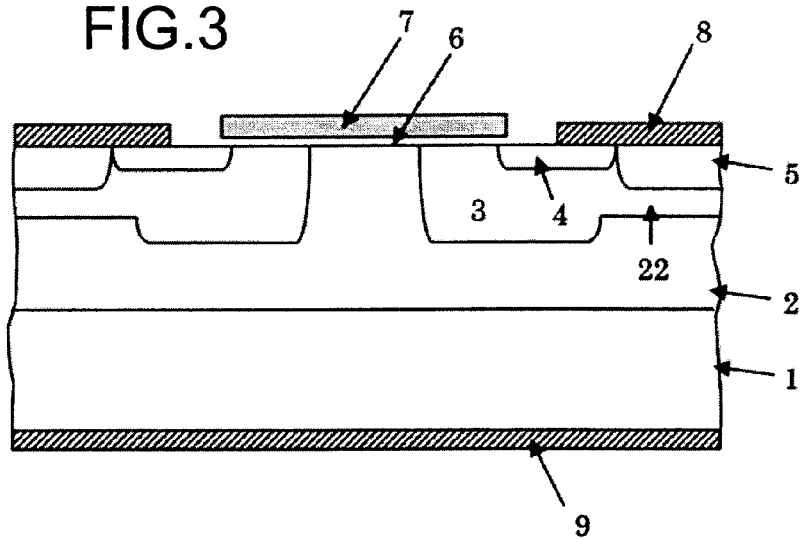
FIG 3 depicts a cross-sectional view of a MOSFET according to a third embodiment of the present invention.

FIG 3 depicts a cross-sectional view of a MOSFET according to a third embodiment of the present invention.

Although the basic structure is the same as the first embodiment, a difference from the first embodiment is in that a thin P-type region 22 is formed in a portion of the P-type region 3 without forming the high-concentration P-type region 21.

The MOSFET formed in this way also causes an avalanche to occur in the PN junction portion between the low-concentration N-type SiC layer 2 and the thin P-type region 22 when high voltage is applied to the drain electrode without a large electric field being applied to the gate oxide film, resulting in the insulation breakdown resistance and the reliability of the gate insulating film exhibiting the same characteristics as the first embodiment.

Fourth Embodiment

Figure 4:
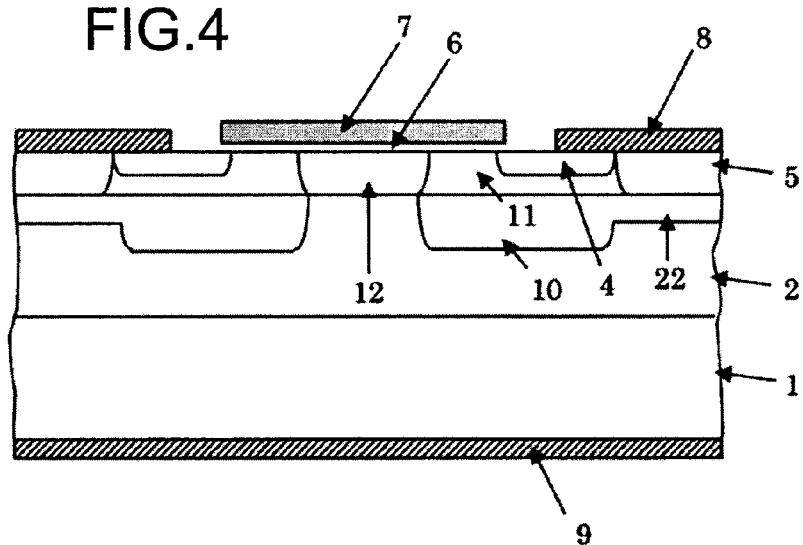
FIG 4 depicts a cross-sectional view of a MOSFET according to a fourth embodiment of the present invention.

FIG 4 depicts a cross-sectional view of a MOSFET according to a fourth embodiment of the present invention.

Although the basic structure is the same as the second embodiment, a difference from the second embodiment is in that a thin P-type region 22 is formed in a portion of the P-type region 10 without forming the high-concentration P-type region 21.

The MOSFET formed in this way also causes an avalanche to occur in the PN junction portion between the low-concentration N-type SiC layer 2 and the thin P-type region 22 when high voltage is applied to the drain electrode without a large electric field being applied to the gate oxide film, resulting in the insulation breakdown resistance and the reliability of the gate insulating film exhibiting the same characteristics as the first embodiment.

Fifth Embodiment

Figure 5:
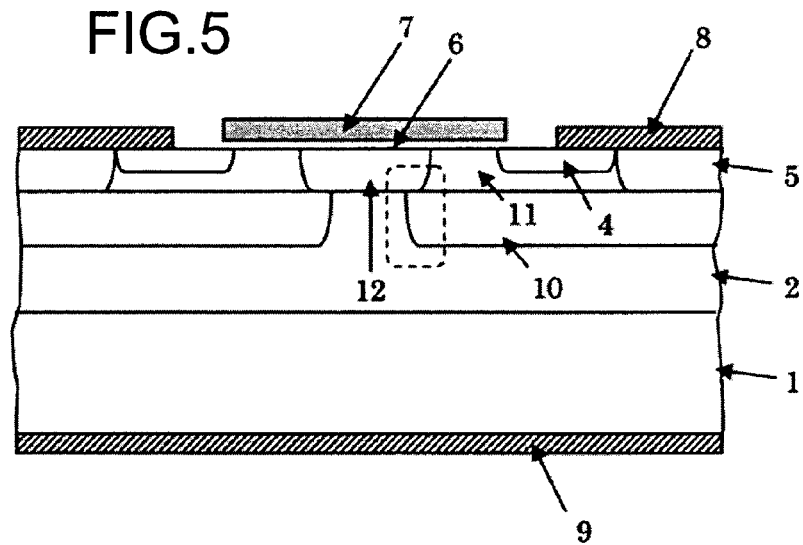
FIG 5 depicts a cross-sectional view of a MOSFET according to the fifth embodiment of the present invention.
Figure 6:
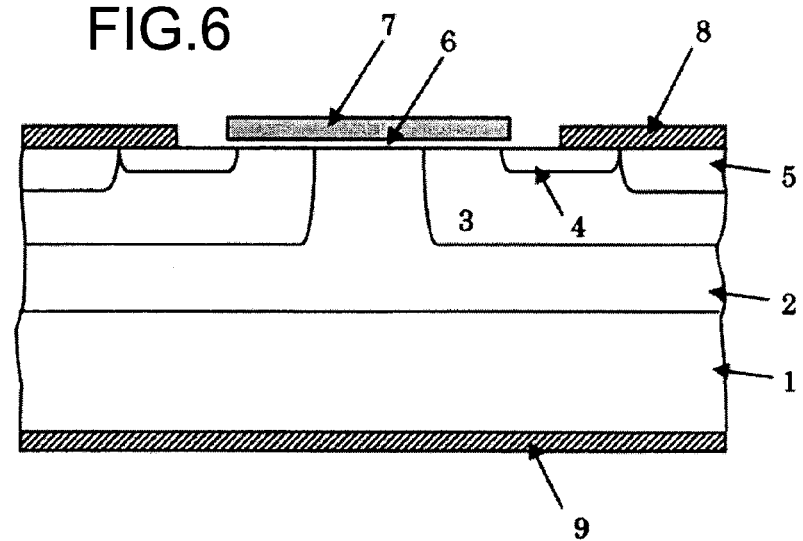
FIG 6 depicts a cross-sectional view of a conventional MOSFET.
Figure 7:
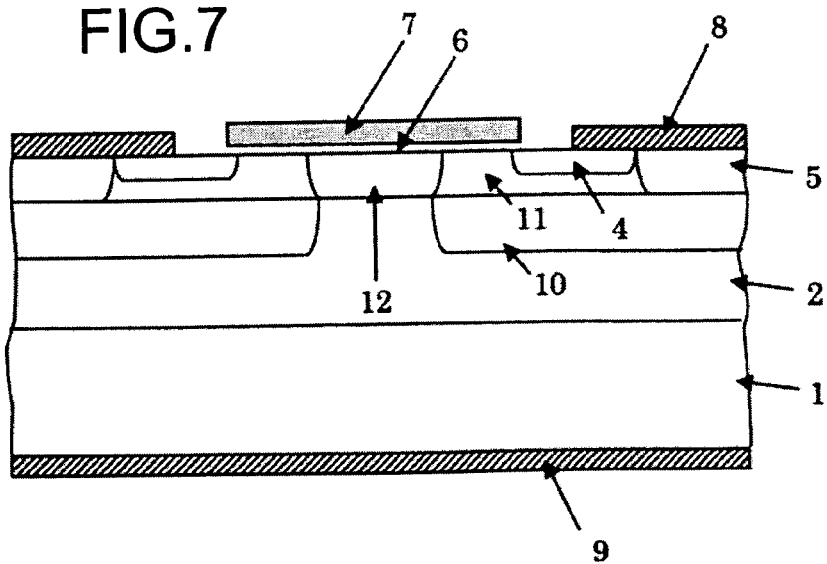
FIG 7 is a cross-sectional view of another conventional MOSFET.

FIG 5 depicts a cross-sectional view of a MOSFET according to the fifth embodiment of the present invention.

Although the basic structure is the same as the second embodiment, a difference from the second embodiment is in that the P-type region 10 is formed to extend to the underside of the N-type region 12 without forming the high-concentration P-type region 21.

The MOSFET formed in this way also causes an avalanche to occur in the PN junction portion between the low-concentration N-type SiC layer 2 and the P-type region 10 extended to the underside of the N-type region 12 when high voltage is applied to the drain electrode without a large electric field being applied to the gate oxide film, resulting in the insulation breakdown resistance and the reliability of the gate insulating film exhibiting the same characteristics as the first embodiment.

EXPLANATIONS OF LETTERS OR NUMERALS

1 N-type SiC substrate
2 N-type SiC layer
3 P-type region
4 N-type source region
5 P-type contact region 6 gate insulting film
7 gate electrode
8 source electrode
9 drain electrode
10 P-type base region
11 P-type SiC layer
12 N-type region
21 high-concentration P-type region
22 thin P-type region

The invention claimed is:

1. A silicon carbide vertical field effect transistor comprising:
   a first-conductive-type silicon carbide substrate;
   a low-concentration first-conductive-type silicon carbide layer formed on a surface of the first-conductive-type silicon carbide substrate;
   second-conductive-type regions selectively formed on a surface of the low-concentration first-conductive-type silicon carbide layer;
   first-conductive-type source regions formed in the second-conductive-type regions;
   a high-concentration second-conductive-type region formed between the first-conductive-type source regions on the second-conductive-type region;
   a source electrode electrically connected directly to the high-concentration second-conductive-type region and a first-conductive-type source region among the first-conductive-type source regions;
   a gate insulating film formed from a first first-conductive-type source region to an adjacent second first-conductive-type source region of the first-conductive-type source regions and over a respective first second-conductive-type region and a respective second second-conductive-type region of the second-conductive-type regions and over the first-conductive-type silicon carbide layer;
   a gate electrode formed on the gate insulating film;
   a drain electrode on a back side of the first-conductive-type silicon carbide substrate, wherein
   a second high-concentration second-conductive-type region is disposed between the first-conductive-type silicon carbide layer and each of the second-conductive-type regions;
   a width of the second high-concentration second-conductive-type region is smaller than that of the second-conductive-type regions; and,
   the second high-concentration second-conductive-type region overlaps the high-concentration second-conductive-type region.

2. The silicon carbide vertical field effect transistor according to claim 1, wherein
   a high-concentration second-conductive-type region is formed under the second-conductive-type region.

3. The silicon carbide vertical field effect transistor according to claim 1, wherein
   a portion of the second-conductive-type region is shallowly formed.

4. The silicon carbide vertical field effect transistor according to claim 1, wherein the gate electrode is free of direct overlap with the high-concentration second-conductive-type region.

5. A silicon carbide vertical field effect transistor comprising:
   a first-conductive-type silicon carbide substrate;
   a low-concentration first-conductive-type silicon carbide layer formed on a surface of the first-conductive-type silicon carbide substrate;
   a second-conductive-type region selectively formed on a surface of the low-concentration first-conductive-type silicon carbide layer;
   second-conductive-type silicon carbide layers formed on surfaces of the first-conductive-type silicon carbide layer and the second-conductive-type region;
   a first-conductive-type region selectively formed on the first-conductive-type silicon carbide layer in the second-conductive-type silicon carbide layers;
   first-conductive-type source regions formed in the second-conductive-type silicon carbide layers;
   a high-concentration second-conductive-type region formed between the first-conductive-type source regions in the second-conductive-type silicon carbide layers;
   a source electrode electrically connected to the high-concentration second-conductive-type region and a first-conductive-type source region among the first-conductive-type source regions;
   a gate insulating film formed from a first first-conductive-type source region to an adjacent second first-conductive-type source region of the first-conductive-type source regions and over a respective first second-conductive-type region and a respective second second-conductive-type region of the second-conductive-type silicon carbide layers and over the first-conductive-type region;
   a gate electrode formed on the gate insulating film; and
   a drain electrode on a back side of the first-conductive-type silicon carbide substrate, wherein
   the high-concentration second-conductive-type region is formed under the second-conductive-type region formed in the first-conductive-type silicon carbide layer.

6. A silicon carbide vertical field effect transistor comprising:
   a first-conductive-type silicon carbide substrate;
   a low-concentration first-conductive-type silicon carbide layer formed on a surface of the first-conductive-type silicon carbide substrate;
   a second-conductive-type region selectively formed on a surface of the low-concentration first-conductive-type silicon carbide layer;
   second-conductive-type silicon carbide layers formed on surfaces of the first-conductive-type silicon carbide layer and the second-conductive-type region;
   a first-conductive-type region selectively formed on the first-conductive-type silicon carbide layer in the second-conductive-type silicon carbide layers;
   first-conductive-type source regions formed in the second-conductive-type silicon carbide layers;
   a high-concentration second-conductive-type region formed between the first-conductive-type source regions in the second-conductive-type silicon carbide layers;
   a source electrode electrically connected to the high-concentration second-conductive-type region and a first-conductive-type source region among the first-conductive-type source regions;
   a gate insulating film formed from a first first-conductive-type source region to an adjacent second first-conductive-type source region of the first-conductive-type source regions and over a respective first second-conductive-type region and a respective second second-conductive-type region of the second-conductive-type silicon carbide layers and over the first-conductive-type region;
   a gate electrode formed on the gate insulating film; and a drain electrode on a back side of the first-conductive-type silicon carbide substrate, wherein a portion of the second-conductive-type region formed in the first-conductive-type silicon carbide layer is shallowly formed.

7. A silicon carbide vertical field effect transistor comprising:

a first-conductive-type silicon carbide substrate;

a low-concentration first-conductive-type silicon carbide layer formed on a surface of the first-conductive-type silicon carbide substrate;

a second-conductive-type region selectively formed on a surface of the low-concentration first-conductive-type silicon carbide layer;

second-conductive-type silicon carbide layers formed on surfaces of the first-conductive-type silicon carbide layer and the second-conductive-type region;

a first-conductive-type region selectively formed on the first-conductive-type silicon carbide layer in the second-conductive-type silicon carbide layers;

first-conductive-type source regions formed in the second-conductive-type silicon carbide layers;

a high-concentration second-conductive-type region formed between the first-conductive-type source regions in the second-conductive-type silicon carbide layers;

a source electrode electrically connected to the high-concentration second-conductive-type region and a first-conductive-type source region among the first-conductive-type source regions;

a gate insulating film formed from a first first-conductive-type source region to an adjacent second first-conductive-type source region of the first-conductive-type source regions and over a respective first second-conductive-type region and a respective second second-conductive-type region of the second-conductive-type silicon carbide layers and over the first-conductive-type region;

a gate electrode formed on the gate insulating film; and a drain electrode on a back side of the first-conductive-type silicon carbide substrate, wherein the second-conductive-type region formed in the first-conductive-type silicon carbide layer is formed to extend under a first-conductive-type region among the first-conductive-type regions formed in the second-conductive-type silicon carbide layer.

\* \* \* \* \*